US010317441B2

(12) United States Patent
Chen et al.

(10) Patent No.: US 10,317,441 B2
(45) Date of Patent: Jun. 11, 2019

(54) PROBLEM DETECTION FOR CABLE-FED-LOADS (71) Applicant: SIGNIFY HOLDING B.V., Eindhoven (NL)

(72) Inventors: Hongxin Chen, Eindhoven (NL); Hong Chen, Eindhoven (NL)

(73) Assignee: SIGNIFY HOLDING B.V., Eindhoven (NL)

(*) Notice: Subject to any disclaimer, the term of this patent is extended or adjusted under 35 U.S.C. 154(b) by 0 days.

(21) Appl. No.: 15/028,436

(22) PCT Filed: Oct. 8, 2014

(86) PCT No.: PCT/EP2014/071490
§ 371 (c)(1),
(2) Date: Apr. 11, 2016

(87) PCT Pub. No.: WO2015/055474
PCT Pub. Date: Apr. 23, 2015

(65) Prior Publication Data
US 2016/0252551 A1    Sep. 1, 2016

(30) Foreign Application Priority Data

Oct. 14, 2013  (WO) ................ PCT/CN2013/001231
Nov. 5, 2013   (EP) ..................................... 13191592

(51) Int. Cl.
*G01R 33/04*        (2006.01)
*G01R 23/16*        (2006.01)
(Continued)

(52) U.S. Cl.
CPC ............. *G01R 23/16* (2013.01); *G01R 31/08* (2013.01); *G01R 31/24* (2013.01); *G01R 31/44* (2013.01);
(Continued)

(58) Field of Classification Search
CPC .. G01R 31/08; G01R 31/10; G01R 19/16571; G01R 31/00; G01R 31/11; G01R 31/28; H04L 41/0677
(Continued)

(56) References Cited

U.S. PATENT DOCUMENTS 6,329,754 B1     12/2001  Daub et al.
2007/0279068 A1*  12/2007  Harres ................. G01R 31/088
                                                         324/522
(Continued)

FOREIGN PATENT DOCUMENTS

CN           1279336 C      12/2004
CN         102012311 A       4/2011
(Continued)

OTHER PUBLICATIONS

Gael Salles et al, "Monitoring of Induction Motor Load by Neural Network Techniques", IEEE Transactions on Power Electronics, Institute of Electrical and Electronics Engineers, USA, vol. 15, No. 4, Jul. 1, 2000, XP011043460, ISSN: 0885-8993.

*Primary Examiner* — Jermele M Hollington
*Assistant Examiner* — Raul J Rios Russo (57) ABSTRACT A device (1) for detecting a problem in or near a load (2, 3) coupled to a cable (6) of a cable system comprises an analyzing part (11) for analyzing a waveform of a cable signal for feeding the load (2, 3) and a deciding part (12) for in response to an analysis result deciding whether a problem in or near the load (2, 3) is present or not. The load (2, 3) may be coupled to the cable (6) via a driver (4, 5). The problem in or near the load (2, 3) may result in the driver (4, 5) amending a value of the waveform at or near a crest or a trough of the waveform. The analysis result may define whether the waveform has been amended by more than a threshold or not. The amending of the value of the waveform
(Continued)

at or near the crest or the trough may comprise a positive pulse added to a crest or a negative pulse added to a trough.

13 Claims, 4 Drawing Sheets

(51) Int. Cl.
G01R 31/08 (2006.01)
G01R 31/44 (2006.01)
G01R 31/24 (2006.01)
H05B 37/03 (2006.01)
G01R 31/11 (2006.01)
G01R 31/10 (2006.01)
G01R 31/28 (2006.01)

(52) U.S. Cl.
CPC ............. *H05B 37/03* (2013.01); *G01R 31/10* (2013.01); *G01R 31/11* (2013.01); *G01R 31/28* (2013.01)

(58) Field of Classification Search
USPC ................ 324/500, 512, 522, 523, 527–533
See application file for complete search history.

(56) References Cited

U.S. PATENT DOCUMENTS

| | | |
|---|---|---|
| 2007/0296416 A1 | 12/2007 | Lee et al. |
| 2008/0024140 A1* | 1/2008 | Henson ................ H02H 1/0015 324/536 |
| 2008/0091308 A1* | 4/2008 | Henson ................ H02H 1/0015 700/293 |
| 2010/0328849 A1* | 12/2010 | Ewing .................... G06F 1/266 361/622 |
| 2012/0194076 A1 | 8/2012 | Murata et al. |
| 2012/0239959 A1* | 9/2012 | Kiuchi ................... G01D 4/002 713/340 |
| 2015/0032098 A1* | 1/2015 | Larson ............... A61B 18/1233 606/35 |
| 2015/0032099 A1* | 1/2015 | Larson ............... A61B 18/1233 606/35 |
| 2015/0074431 A1* | 3/2015 | Nguyen .................. H02J 3/006 713/300 |
| 2015/0207317 A1* | 7/2015 | Radermacher ............ H02J 1/06 307/4 |

FOREIGN PATENT DOCUMENTS

| | | |
|---|---|---|
| CN | 202652662 U | 1/2013 |
| EP | 0301528 A1 | 2/1989 |
| EP | 0766905 B1 | 6/2001 |
| GB | 2074328 A | 10/1981 |
| JP | 20307892 A | 11/1998 |
| JP | 2001307892 A | 11/2001 |
| KR | 2005109826 A | 11/2005 |
| WO | 9636202 A1 | 11/1996 |
| WO | 0040982 A1 | 7/2000 |
| WO | 2006061693 A1 | 6/2006 |

\* cited by examiner

PROBLEM DETECTION FOR CABLE-FED-LOADS

CROSS-REFERENCE TO PRIOR APPLICATIONS

This application is the U.S. National Phase application under 35 U.S.C. § 371 of International Application No. PCT/EP2014/071490, filed on Oct. 8, 2014, which claims the benefit of Chinese Patent Application No. PCT/CN2013/001231, filed on Oct. 14, 2013 and European Patent Application 13191592.8, filed on Nov. 5, 2013. These applications are hereby incorporated by reference herein.

FIELD OF THE INVENTION

The invention relates to a device for detecting a problem in or near at least one of a plurality of loads coupled to a cable of a cable system. The invention further relates to a cable system, to a method, to a computer program product and to a medium.

An example of such a cable system is a cable coupled to loads such as for example lamps for road lighting. The lamps may be light emitting diode lamps or any other kind of lamps.

BACKGROUND OF THE INVENTION

WO 96/36202 A1 discloses a remote monitoring and controlling device for a discharge lamp. This device operates with disadvantageous messages.

SUMMARY OF THE INVENTION

It is an object of the invention to provide an improved device. Further objects of the invention are to provide a cable system, an improved method, a computer program product and a medium.

According to a first aspect, a device is provided for detecting a problem in or near at least one of a plurality of loads coupled to a cable of a cable system, the device comprising
   an analyzing part for analyzing a waveform of a cable signal for feeding the plurality of loads, and
   a deciding part for in response to an analysis result from the analyzing part deciding whether the problem in or near the at least one of the plurality of loads is present or not.

An analyzing part analyzes a waveform of a cable signal for feeding the plurality of loads. Such a cable signal can for example be a current signal that flows through the cable as a result of a voltage signal being presented to the cable, or can for example be a voltage signal that is present across the cable as a result of a current signal being presented to the cable. To analyze the waveform of the current signal, the current signal may for example (need to) be converted into a voltage signal, and to analyze the waveform of the voltage signal, the voltage signal may for example (need to) be converted into a current signal. The cable signal may be a real feeding signal or may be a simulated feeding signal.

A deciding part decides in response to an analysis result from the analyzing part whether the problem in or near the at least one of the plurality of loads is present or not. As a result, the device only uses the waveform of the feeding signal to detect a problem in or near at least one of a plurality of loads coupled to a cable of a cable system. Such a device does not require disadvantageous messages to be exchanged. This is a great advantage.

An analyzing part can for example be a dedicated hardware circuit or a programmable hardware circuit or a software part or a mixture of two or more of these. A deciding part can for example be a dedicated hardware circuit or a programmable hardware circuit or a software part or a mixture of two or more of these. Hardware circuits may for example comprise a processor or may form part of a processor. Software parts may for example form part of a processor. One processor may have several functions.

An embodiment of the device is defined by the waveform comprising crests and troughs, the respective loads being coupled to the cable via respective drivers at respective locations, the problem in or near a load resulting in a corresponding driver amending at least one value of the waveform at or near at least one of the crests and the troughs, and the analysis result defining whether the waveform has been amended by more than a threshold or not. Preferably, the analyzing part defines how much the waveform has been amended, preferably with respect to a threshold, and the deciding part compares the possibly amended waveform with the threshold.

An embodiment of the device is defined by the amending of the at least one value of the waveform at or near the at least one of the crests and the troughs comprising a positive pulse added to a crest or a negative pulse added to a trough. An addition of a positive pulse to a crest increases a local amplitude of the waveform at the crest. An addition of a negative pulse to a trough corresponds with a subtraction of a positive pulse from the trough and increases a local amplitude of the waveform at the trough. Drivers that produce such kind of pulses in case of problems in or near the loads are for example drivers with hiccup-modes, without having excluded other kinds of drivers.

An embodiment of the device is defined by the analyzing part comprising
   a first comparing part for comparing first amplitudes of the waveform at the crests with a first value and for comparing second amplitudes of the waveform at the troughs with a second value during a time-interval comprising several periods of the cable signal, and
   a first counting part for counting a number of first and second amplitudes that have exceeded the first and second values, the threshold defining a minimum for said number of first and second amplitudes.

According to this first implementation, the analyzing part compares amplitudes with values and counts the amplitudes that have exceeded the values, and the deciding part compares the count with the threshold.

An embodiment of the device is defined by the analyzing part further comprising
   a rectifying part for rectifying the waveform, the troughs becoming further crests, the first and second amplitudes becoming third amplitudes, the first and second values becoming an identical value equal to a sum of a median value of the third amplitudes and twice a difference between the median value and a minimum third amplitude. This embodiment is a simple and practical embodiment for the first implementation that has proven to perform well.

An embodiment of the device is defined by the analyzing part comprising
   a second comparing part for comparing the waveform with a reference waveform per period of the cable signal during a time-interval comprising several periods of the cable signal, and a second counting part for counting a number of periods wherein the waveform deviates too much from the reference waveform, the threshold defining a minimum for said number of periods.

According to this second implementation, the analyzing part compares waveforms and counts periods, and the deciding part compares the count with the threshold.

An embodiment of the device is defined by a deviation between the waveform and the reference waveform being a distance between both waveforms at a crest or a trough of the waveforms. This embodiment is a simple and practical embodiment for the second implementation that has proven to perform well.

An embodiment of the device is defined by the analyzing part comprising a deriving part for deriving first coefficients from a first waveform determined in a situation with a problem and for deriving second coefficients from a second waveform determined in a situation without a problem and for deriving third coefficients from the waveform determined in an unknown situation, a converting part for converting the respective first and second and third coefficients into respective first and second and third coordinates, and a classifying part for defining a first area based on the first coordinates and a second area based on the second coordinates in a space and for allocating the third coordinates to one of the first and second areas.

According to this third implementation, the analyzing part derives first to second coefficients from waveforms determined in known situations and derives third coefficients from a waveform determined in an unknown situation and converts the first to third coefficients into first to third coordinates and defines first and second areas in a space based on the first and second coordinates and allocates the third coordinates to one of these areas, and the deciding part converts an allocation of the third coordinates. In this case, the threshold corresponds with a line or with several lines or with a third area situated between the first and second areas. An allocation of the third coordinates to the first area corresponds with "a problem" and an allocation of the third coordinates to the second area corresponds with "no problem".

An embodiment of the device is defined by the classifying part being a self-learning classifying part, wherein the third coefficients become, after the problem has been decided to be present, first coefficients, or, after the problem has been decided to be not present, second coefficients, to update parameters of the classifying part. A self-learning classifying part will usually improve itself during time of life.

According to a highly advantageous embodiment, two of the first, second and third implementations are combined, whereby a problem is sufficiently detected in case only one implementation decides so or whereby a problem is sufficiently detected in case both implementations decide so. According to another highly advantageous embodiment, the first, second and third implementations are combined, whereby a problem is sufficiently detected in case only one implementation decides so or whereby a problem is sufficiently detected in case two out of three implementations decide so or in case three out of three implementations decide so.

An embodiment of the device is defined by the device further comprising a noise filter for filtering high-frequency noise present on the cable signal. High frequency noise is noise at a frequency higher than a frequency of a pulse added to a crest or a trough. The noise filter may for example be a dedicated hardware circuit or a programmable hardware circuit or a software part or a mixture of two or more of these. Hardware circuits may for example comprise a processor or may form part of a processor. Software parts may for example form part of a processor. One processor may have several functions.

An embodiment of the device is defined by the cable signal being a current signal flowing through conductors of the cable in response to a voltage signal being offered to the conductors of the cable. Usually, a voltage signal is offered to conductors of the cable, and the waveform of a current signal is to be investigated for detecting possible problems.

According to a second aspect, a cable system is provided comprising a device as defined above and further comprising the cable and/or the loads.

According to a third aspect, a method is provided for detecting a problem in or near at least one of a plurality of loads coupled to a cable of a cable system, the method comprising steps of analyzing a waveform of a cable signal for feeding the plurality of loads, and in response to an analysis result deciding whether the problem in or near the at least one of the plurality of loads is present or not.

According to a fourth aspect, a computer program product is provided for performing the steps of the method as defined above when run on a computer.

According to a fifth aspect, a medium is provided for storing and comprising the computer program product as defined above.

Each one of the first and second comparing parts such as for example comparators, first and second counting parts such as for example counters, the rectifying part such as for example a rectifier, the deriving part such as for example a deriver, the converting part such as for example a converter and the classifying part such as for example a classifier may for example be a dedicated hardware circuit or a programmable hardware circuit or a software part or a mixture of two or more of these. Hardware circuits may for example comprise a processor or may form part of a processor. Software parts may for example form part of a processor. One processor may have several functions.

An insight is that disadvantageous messages are to be avoided when trying to detect problems in or near loads coupled to a cable of a cable system. A basic idea is that a waveform of a cable signal for feeding the loads is to be analyzed.

A problem to provide an improved device has been solved. A further advantage is that several implementations are possible.

These and other aspects of the invention will be apparent from and elucidated with reference to the embodiments described hereinafter.

DETAILED DESCRIPTION OF EMBODIMENTS

Figure 1:
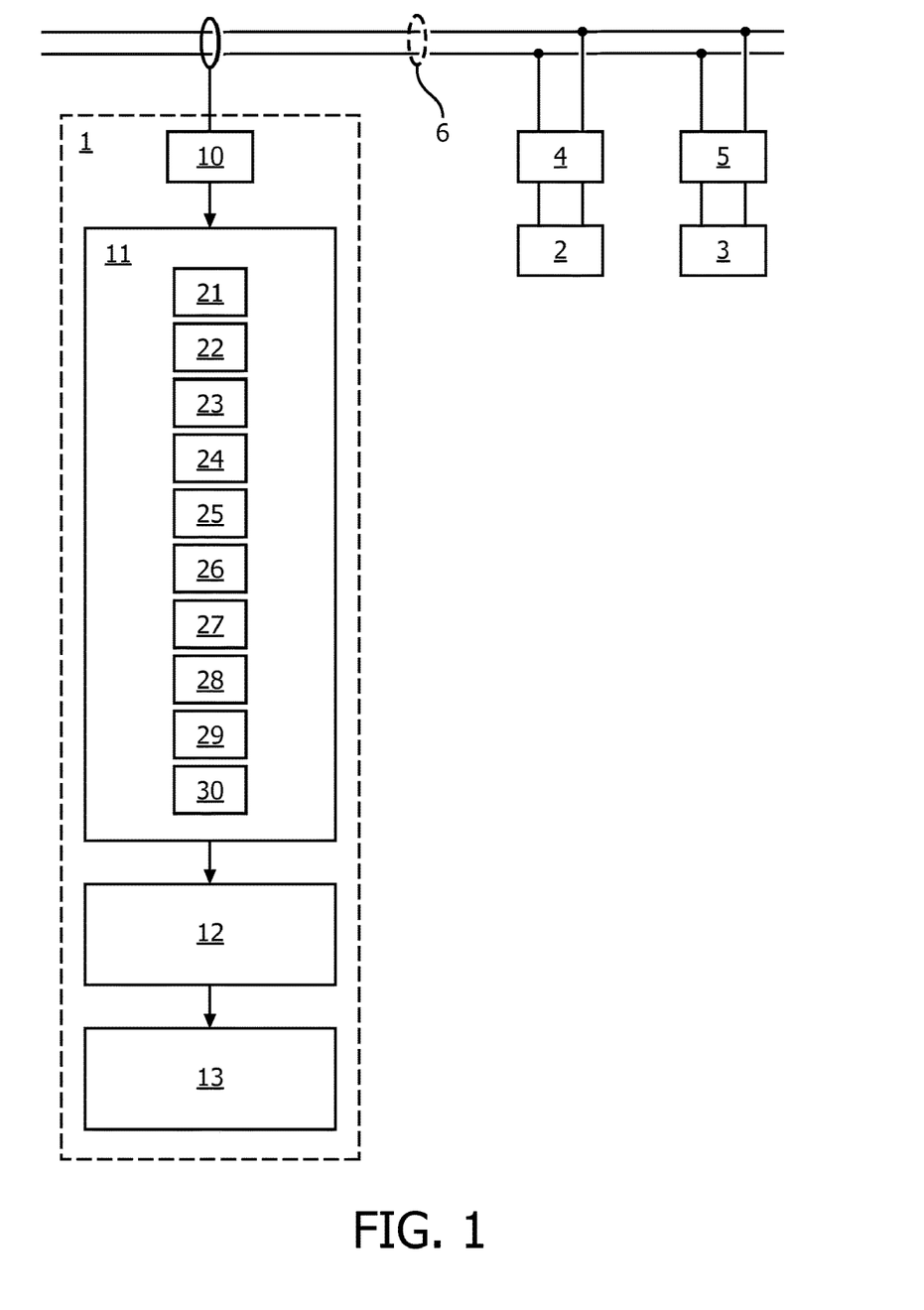
FIG. 1 shows embodiments of a device in a cable system.

In the FIG. 1, embodiments of a device 1 in a cable system are shown. The cable system further comprises a cable 6 coupled to a load 2 via a driver 4 and to a load 3 via a driver 5. Alternatively, the drivers 4, 5 may form part of the loads 2, 3. The device 1 comprises a cable-interface 10 for sensing a cable signal in the form of a current signal flowing through conductors of the cable 6 in response to a voltage signal being offered to the conductors of the cable 6. Alternatively, the cable-interface 10 may sense a cable signal in the form of a voltage signal present across conductors of the cable 6 in response to a current signal being offered to the conductors of the cable 6.

The device 1 is arranged to detect a problem in or near at least one of a plurality of loads 2, 3 coupled to the cable 6 of the cable system and comprises an analyzing part 11 for analyzing a waveform of the cable signal for feeding the plurality of loads 2, 3 and a deciding part 12 for in response to an analysis result from the analyzing part 11 deciding whether the problem in or near the at least one of the plurality of loads 2, 3 is present or not. Alternatively, the cable-interface 10 may form part of the analyzing part 11 or of the cable 6.

Usually, the waveform comprises crests and troughs, and a problem in or near a load 2, 3 such as for example a malfunctioning load 2, 3 or a missing load 2, 3 or a broken connection between a load 2, 3 and a driver 4, 5 etc. may result in a corresponding driver 4, 5 amending at least one value of the waveform at or near at least one of the crests and the troughs. However, alternatively, it is not to be excluded that the load 2, 3 itself in a malfunctioning situation may amend at least one value of the waveform at or near at least one of the crests and the troughs. An analysis result from the analyzing part 11 may define whether the waveform has been amended by more than a threshold or not. Further usually, an amendment of the at least one value of the waveform at or near the at least one of the crests and the troughs may comprise a positive pulse added to (one or more values at) a crest or a negative pulse added to (one or more values at) a trough. An addition of a negative pulse to a trough of course corresponds with a subtraction of a positive pulse from the trough.

Figure 2:
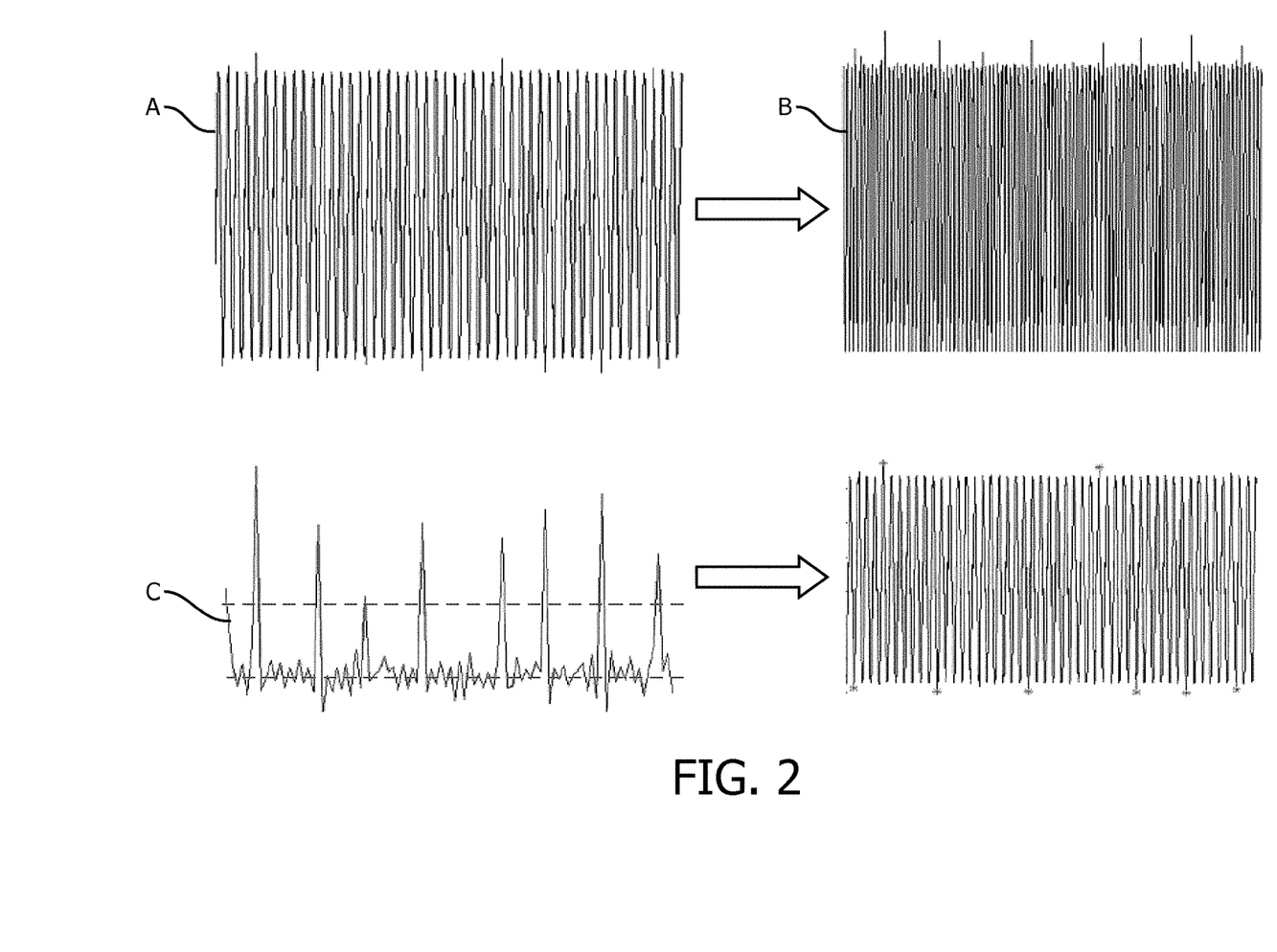
FIG. 2 shows a performance of a first implementation.

According to a first implementation as further explained in view of the FIG. 2, the analyzing part 11 may comprise a first comparing part 21 for comparing first amplitudes of the waveform at the crests with a first value and for comparing second amplitudes of the waveform at the troughs with a second value during a time-interval comprising several periods of the cable signal, and a first counting part 22 for counting a number of first and second amplitudes that have exceeded the first and second values, the threshold defining a minimum for said number of first and second amplitudes. Preferably, the analyzing part 11 may further comprise a rectifying part 23 for rectifying the waveform, the troughs becoming further crests, the first and second amplitudes becoming third amplitudes, the first and second values becoming an identical value equal to a sum of a median value of the third amplitudes and twice a difference between the median value and a minimum third amplitude.

Figure 3:
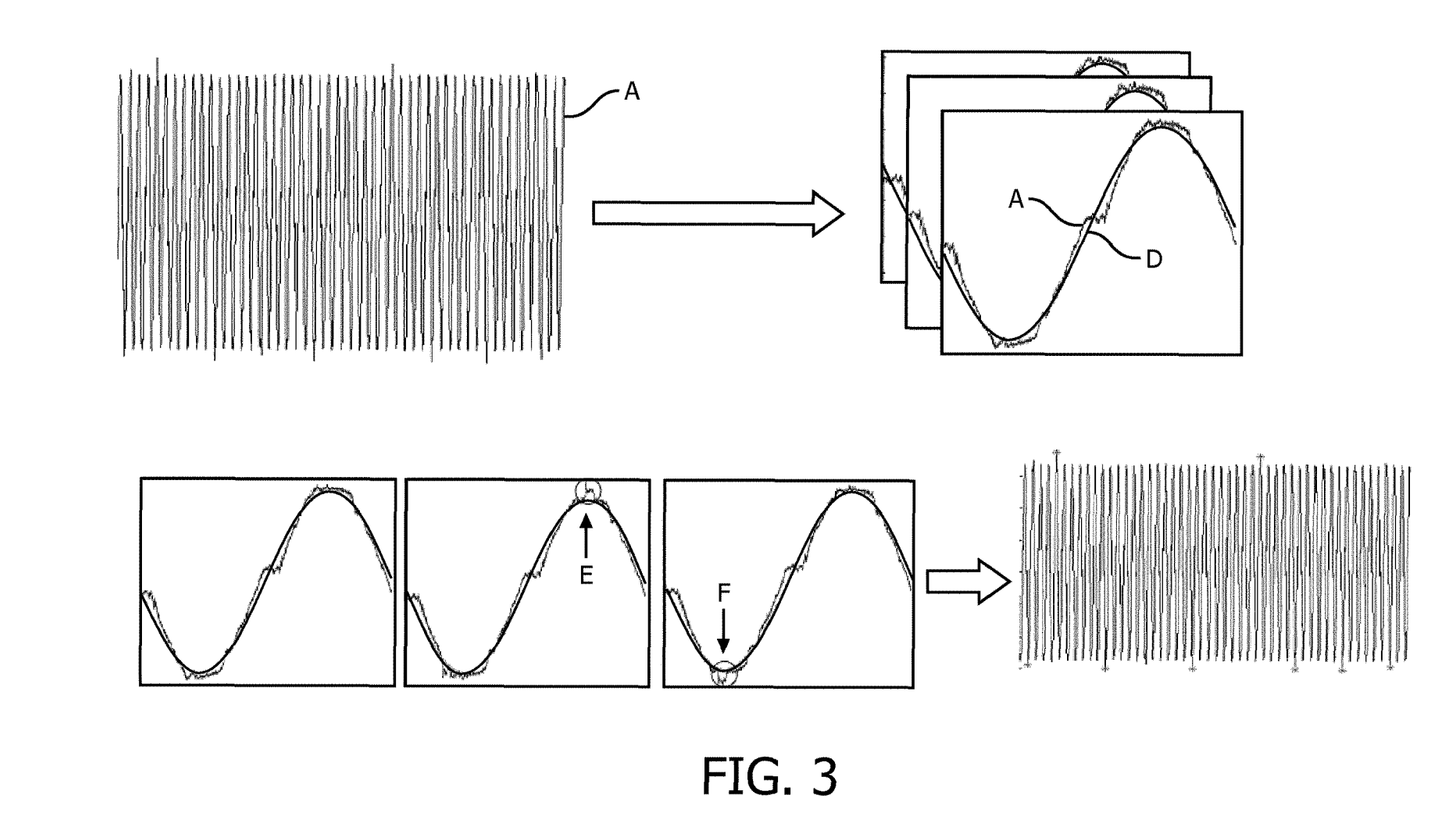
FIG. 3 shows a performance of a second implementation.

According to a second implementation as further explained in view of the FIG. 3, the analyzing part 11 may comprise a second comparing part 24 for comparing the waveform with a reference waveform per period of the cable signal during a time-interval comprising several periods of the cable signal, and a second counting part 25 for counting a number of periods wherein the waveform deviates too much from the reference waveform, the threshold defining a minimum for said number of periods. Preferably, a deviation between the waveform and the reference waveform is a distance between both waveforms at a crest or a trough of the waveforms.

Figure 4:
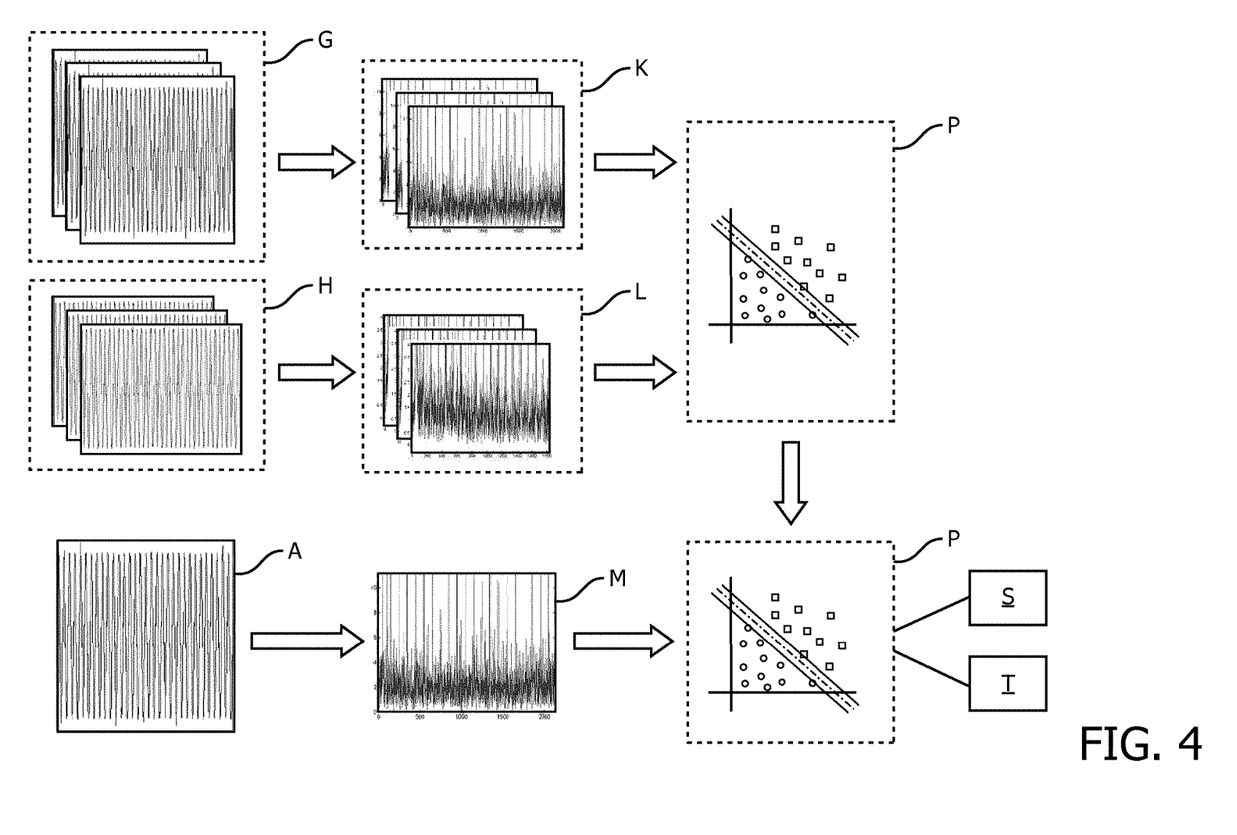
FIG. 4 shows a performance of a third implementation.

According to a third implementation as further explained in view of the FIG. 4, the analyzing part 11 may comprise a deriving part 26 for deriving first coefficients from a first waveform determined in a situation with a problem and for deriving second coefficients from a second waveform determined in a situation without a problem and for deriving third coefficients from the waveform determined in an unknown situation, a converting part 27 for converting the respective first and second and third coefficients into respective first and second and third coordinates, and a classifying part 28 for defining a first area based on the first coordinates and a second area based on the second coordinates in a space and for allocating the third coordinates to one of the first and second areas. Preferably, the classifying part 28 is a self-learning classifying part, wherein the third coefficients become, after the problem has been decided to be present, first coefficients, or, after the problem has been decided to be not present, second coefficients, to update parameters of the classifying part 28.

The device 1 may comprise a noise filter 29 for filtering high-frequency noise present on the cable signal and a memory 30 for storing waveforms, thresholds, amplitudes, counted numbers, coefficients, coordinates, spaces, areas and parameters. Alternatively, the noise filter may be located outside the device 1. The device 1 may further comprise a man-machine-interface 13 for informing a person about the possible problem.

In the FIG. 2, a performance of the first implementation is shown. The first comparing part 21 compares first amplitudes of the waveform A at the crests with a first value and compares second amplitudes of the waveform A at the troughs with a second value during a time-interval comprising several periods of the cable signal. The first counting part 22 counts a number of first and second amplitudes that have exceeded the first and second values. A threshold defines a minimum for said number of first and second amplitudes. To simplify this procedure, the rectifying part 23 may rectify the waveform A into a rectified waveform B. The troughs then become further crests, the first and second amplitudes then become third amplitudes, and the first and second values then become an identical value C that may for example be chosen equal to a sum of a median value of the third amplitudes and twice a difference between the median value and a minimum third amplitude.

In the FIG. 3, a performance of the second implementation is shown. The second comparing part 24 compares the waveform A with a reference waveform D per period of the cable signal during a time-interval comprising several periods of the cable signal The second counting part 25 counts a number of periods wherein the waveform A deviates too much from the reference waveform D, in this case a middle period of three periods wherein a positive pulse is located on a crest E and a last period of three periods wherein a negative pulse is located on a trough F. The threshold defines a minimum for said number of periods. Preferably, a deviation between the waveform A and the reference waveform D may be a distance between both waveforms A and D at a crest or a trough of the waveforms A and D.

In the FIG. 4, a performance of the third implementation is shown. The deriving part 26 derives first coefficients K from a first waveform G determined in a situation wherein a problem exists and derives second coefficients L from a second waveform H determined in a situation wherein no problem exists and derives third coefficients M from the waveform A determined in an unknown situation. The coefficients K, L, M are for example Fast Fourier Transform coefficients, without having excluded other kinds of coefficients. The converting part 27 converts the respective first and second and third coefficients K, L, M into respective first and second and third coordinates. The classifying part 28 defines a first area based on the first coordinates and a second area based on the second coordinates in a space P and allocates the third coordinates to one of the first and second areas. One or more borderlines between the first and second areas define the threshold for the third coordinates. The deciding part 12 converts an allocation of the third coordinates. This will result in a detection of a problem (failure S) or not (no failure T). The classifying part 28 may for example be a support vector machine without having excluded other kinds of machines. Here, the threshold corresponds with a line or with several lines or with a third area situated between the first and second areas. An allocation of the third coordinates to the first area results in the "failure S" and an allocation of the third coordinates to the second area results in a "no failure T".

Preferably, the classifying part 28 is a self-learning classifying part, that will usually improve itself during time of life. Then, the third coefficients become, after the problem has been decided to be present, first coefficients, or, after the problem has been decided to be not present, second coefficients, to update parameters of the classifying part 28.

According to a highly advantageous embodiment, two of the first, second and third implementations are combined, whereby a problem is sufficiently detected in case at least one implementation has decided so (preferably two). According to another highly advantageous embodiment, the first, second and third implementations are combined, whereby a problem is sufficiently detected in case at least one implementation has decided so (preferably at least two).

Summarizing, a device 1 for detecting a problem in or near a load 2, 3 coupled to a cable 6 of a cable system comprises an analyzing part 11 for analyzing a waveform of a cable signal for feeding the load 2, 3 and a deciding part 12 for in response to an analysis result deciding whether a problem in or near the load 2, 3 is present or not. The load 2, 3 may be coupled to the cable 6 via a driver 4, 5. The problem in or near the load 2, 3 may result in the driver 4, 5 amending a value of the waveform at or near a crest or a trough of the waveform. The analysis result may define whether the waveform has been amended by more than a threshold or not. The amending of the value of the waveform at or near the crest or the trough may comprise a positive pulse added to a crest or a negative pulse added to a trough.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A device for detecting a problem in at least one of a plurality of loads coupled to a cable of a cable system, the device comprising:
   a cable interface, coupled to the cable system, to sense a cable signal in response to a signal being offered to the cable, wherein the cable signal is a feeding signal or a simulated feeding signal that supplies power to the cable system, wherein the waveform includes crests and troughs and wherein respective loads of the plurality of loads are coupled to the cable via respective drivers at respective locations;
   a processor coupled to the cable interface;
   a memory coupled to processor to store at least a waveform of the cable signal feeding the plurality of loads;
   wherein the processor analyzes the waveform of the cable signal to determine whether the problem in the at least one of the plurality of loads is present or not without receiving a message or communication from any of the loads and without modification or direct coupling to any of the loads, by amending
   a corresponding driver, when a problem in a load occurs, at least one value of the waveform at or near at least one of the crests and the troughs, and the processor determines whether the waveform has been amended by more than a threshold; and
   a user interface to inform the user of the problem.

2. The device as defined in claim 1, the amending of the at least one value of the waveform at or near the at least one of the crests and the troughs includes a positive pulse added to a crest or a negative pulse added to a trough.

3. The device as defined in claim 1, the processor is further configured to compare first amplitudes of the waveform at the crests with a first value and compare second amplitudes of the waveform at the troughs with a second value during a time-interval comprising several periods of the cable signal, and count a number of first and second amplitudes that have exceeded the first and second values, the threshold defining a minimum for said number of first and second amplitudes.

4. The device as defined in claim 3, the processor is further configured to rectify the waveform, the troughs becoming further crests, the first and second amplitudes becoming third amplitudes, the first and second values becoming an identical value equal to a sum of a median value of the third amplitudes and twice a difference between the median value and a minimum third amplitude.

5. The device as defined in claim 1, the processor is further configured to compare the waveform with a reference waveform per period of the cable signal during a time-interval comprising several periods of the cable signal, and count a number of periods wherein the waveform deviates too much from the reference waveform, the threshold defining a minimum for said number of periods.

6. The device as defined in claim 5, a deviation between the waveform and the reference waveform being a distance between both waveforms at a crest or a trough of the waveforms.

7. The device as defined in claim 1, the processor is further configured to derive first coefficients from a first waveform determined in a situation with a problem and for deriving second coefficients from a second waveform determined in a situation without a problem and for deriving third coefficients from the waveform determined in an unknown situation, convert the respective first and second and third coefficients into respective first and second and third coordinates, and define a first area based on the first coordinates and a second area based on the second coordinates in a space and for allocating the third coordinates to one of the first and second areas.

8. The device as defined in claim 7, the processor's defining the first and second areas is self-learning, wherein the third coefficients become, after the problem has been decided to be present, first coefficients, or, after the problem has been decided to be not present, second coefficients, to update parameters of the defining the first and second areas.

9. The device as defined in claim 1, the device further comprising a noise filter for filtering high-frequency noise present on the cable signal.

10. The device as defined in claim 1, the cable signal being a current signal flowing through conductors of the cable in response to a voltage signal being offered to the conductors of the cable.

11. A cable system comprising a device as defined in claim 1 and further comprising the cable and/or the loads.

12. A method for detecting a problem in at least one of a plurality of loads coupled to a cable of a cable system, the method comprising steps of:

sensing a cable signal in response to a signal being offered to the cable, using a cable interface coupled to the cable system, wherein the cable signal is a feeding signal or a simulated feeding signal that supplies power to the cable system, wherein the waveform includes crests and troughs and wherein respective loads of the plurality of loads are coupled to the cable via respective drivers at respective locations;

storing at least a waveform of the cable signal feeding the plurality of loads;

analyzing, using a processor coupled to the cable interface, the waveform of a cable signal to determine whether the problem in the at least one of the plurality of loads is present or not without receiving a message or communication from any of the loads and without modification or direct coupling to any of the loads;

amending, when a problem in a load occurs, using a corresponding driver, at least one value of the waveform at or near at least one of the crests and the troughs, and determining, using the processor, whether the waveform has been amended by more than a threshold.

13. A non-transitory computer readable storage medium including a computer program including a set of instructions executable by a processor to detecting a problem in at least one of a plurality of loads coupled to a cable of a cable system, the computer readable storage medium comprising code for:

sensing a cable signal in response to a signal being offered to the cable, using a cable interface coupled to the cable system, wherein the cable signal is a feeding signal or a simulated feeding signal that supplies power to the cable system, wherein the waveform includes crests and troughs and wherein respective loads of the plurality of loads are coupled to the cable via respective drivers at respective locations;

storing at least a waveform of the cable signal feeding the plurality of loads;

analyzing, using a processor coupled to the cable interface, the waveform of a cable signal to determine whether the problem in the at least one of the plurality of loads is present or not without receiving a message or communication from any of the loads and without modification or direct coupling to any of the loads;

amending, when a problem in a load occurs, using a corresponding driver, at least one value of the waveform at or near at least one of the crests and the troughs, and determining, using the processor, whether the waveform has been amended by more than a threshold.

* * * * *